United States Patent [19]

Ouellet

[11] Patent Number: 5,364,818
[45] Date of Patent: Nov. 15, 1994

[54] SOG WITH MOISTURE RESISTANT PROTECTIVE CAPPING LAYER

[75] Inventor: Luc Ouellet, Granby, Canada

[73] Assignee: Mitel Corporation, Kanata, Canada

[21] Appl. No.: 962,214

[22] PCT Filed: May 28, 1991

[86] PCT No.: PCT/CA91/00177
§ 371 Date: Jan. 26, 1993
§ 102(e) Date: Jan. 26, 1993

[87] PCT Pub. No.: WO91/19317
PCT Pub. Date: Dec. 12, 1991

[30] Foreign Application Priority Data

May 29, 1990 [CA] Canada .................. 2017720

[51] Int. Cl.$^5$ ........................... H01L 21/90
[52] U.S. Cl. .................... 437/195; 437/231;
437/978; 437/982; 156/630
[58] Field of Search ............. 437/195, 231, 978, 982;
148/15, 133; 156/630

[56] References Cited

U.S. PATENT DOCUMENTS 5,252,515  10/1993  Tsai ........................ 437/195

FOREIGN PATENT DOCUMENTS

0180458  8/1986  Japan .................. 437/231
0155625  6/1988  Japan .................. 437/195
0064340  3/1989  Japan .................. 437/195
0152258  6/1990  Japan .................. 437/195
4199625  7/1992  Japan .................. 437/231
9109422  6/1991  WIPO .................. 437/231

Primary Examiner—Brian E. Hearn
Assistant Examiner—J. Chang
Attorney, Agent, or Firm—Marks & Clerk

[57] ABSTRACT

A method of planarizing a semiconductor wafer having interconnect tracks of formed thereon, comprises applying a layer of inorganic spin-on glass to the wafer, curing the spin-on glass at a temperature not exceeding about 450° C., then placing the wafer in a dielectric deposition chamber, subjecting the wafer to in situ disconnection and outgassing of water and reaction byproducts, and then capping the wafer in a moisture-free environment with a protective dielectric layer resistant to moisture diffusion.

11 Claims, 5 Drawing Sheets

SOG WITH MOISTURE RESISTANT PROTECTIVE CAPPING LAYER

This invention relates generally to a process for applying spin-glass to a substrate, and more particularly to a process for the planarization of semiconductor wafers. The invention is especially applicable to inorganic spin-on glasses.

Spin-on glasses (SOG) are proprietary liquid solutions containing siloxane or silicate based monomers diluted in various kinds of solvents or alcohols. They are commonly used for the planarization of semiconductor wafers, i.e. the filling and levelling of the trenches formed between interconnect paths deposited on the wafer. On coating and curing of spin-on glasses, monomers are polymerized by condensation and release of water, solvent, and alcohol. The condensed material is a thin solid film having mechanical, chemical and electrical properties which depend on the starting solution, and the coating and curing process.

There are more than one hundred different SOG solutions currently available. These are classified into two major families:
1) Inorganic silicates.
2) Quasi inorganic siloxanes (methyl-siloxanes, ethyl-, phenyl-, butyl-).

The various components of a SOG solution (silicon containing oligomer, solvents mixture, and residual water) are in equilibrium in the liquid phase. Immediately after coating, volatile products (solvents and water) evaporate, and polymerization occurs due to the formation by condensation of silanol, Si—OH, bonds. These produce more water according to the following reaction (i):

Polymerization continues until the distance between neighbouring silanol groups, Si—OH, becomes too large or when too much by-product, such as water, blocks the condensation reaction. Heating is then required to permit further densification.

The properties of the films, such as higher density, reduced hydrogen content, higher coefficient of thermal expansion, better-flexibility and higher resistance to cracking, made from both types of SOG solution can be improved by incorporating phosphorus organometallic catalyst. In the SOG solution, the phosphorus organometallic molecules are generally not well bound to the silicon-containing compounds. Strong bonding generally occurs in the solid state when the film is exposed to relatively high temperatures. These organometallic molecules can nevertheless polymerize in the solution to form poorly bonded polymers that dissociate and form stable polymers during coating and condensation of the film. As an example, a Japanese SOG solution alloyed with a phosphorus organometallic molecule, $P_wO_x(OH)_y(OC_2H_5)_z$, which is in dynamic equilibrium with the water and ethanol, $C_2H_5OH$ behaves as shown in reaction (ii):

In theory, the phosphorus atom connects to the $SiO_2$ network with three P.O.Si bonds. These bonds are formed by the condensation of —P.OH or —P.OC$_2$H$_5$, and —Si.OH.

While the properties of the SOG films can be improved by alloying with phosphorus organometallic catalyst the presence of water $H_2O$ hydrogen $H^+$, hydroxyl $OH^-$, hydronium $H_3O^+$, lithium $Li^+$, sodium $Na^+$, and potassium $K^+$ ions causes serious instabilities in MOS devices.

Some phosphorus bound in the dielectrics deposited in the upper levels of these sensitive ICs can eliminate such negative effects by acting as a getter. As an example, a 23 nm thick 6.0 mole % $P_2O_5$ phosphosilicate glass protective layer increases by twelve orders of magnitude the resistance of a 100 nm $SiO_2$ film against sodium, $Na^+$, contamination at 80° C. and 2.0 MV/cm electrical field [See for example, J. R. Davis, Instabilities in MOS Devices, Gordon and Breach, Science The mechanism for proton H+, lithium Li+, sodium Na+, and potassium K+ ion gettering as follows (iii):

The free proton, H+, lithium Li+, and potassium K+ ion, is trapped by the —P:O double bond. This results in the formation of a local positively charged centre with a certain orientation freedom; the formed —P.O+ charged centre can orient itself under an externally applied electrical field and the material can show a dipolar polarization behaviour.

Similarly, the mechanism for hydroxyl ion, OH−, gettering is the following (iv):

The free hydroxyl ion, OH−, is trapped by the —P:O double bond. This also results in the formation of a local negatively charged centre with certain orientation freedom; the material can also show a dipolar polarization behaviour.

Similarly, the mechanism for water, H₂O, gettering is the following (v):

The free water, H₂O, is trapped by the —P:O double bond. This does not result in the formation of a local charged centre and the material cannot normally show a dipolar polarization behaviour.

This dipolar polarization is nevertheless known and its understanding is possible when one considers that water dissociates during its adsorption, absorption and permeation:

$$H_2O \rightarrow H^+ + OH^-$$

$$H^+ + H_2O \rightarrow H_3O^+$$

and the behaviour of water is in fact a combination of the proton, H+, hydroxyl, OH−, and hydronium, H₃O+, ones. The hydronium, H₃O+, behaviour is the following (vi):

+ and the complete gettering necessitate the use of two —P:O double bounds for each hydronium, H₃O+, ion to be trapped. The obtained material is also polarizable.

During the fabrication of multilevel interconnects ICs, it is normally necessary to use at least two levels of aluminum alloy interconnects. These two levels of aluminum alloys must be mutually electrically isolated by low temperature glasses. Since typical exposure temperature do not exceed 450° C. to prevent hillocking and stress migration problems, the deposited glasses are generally very porous and do accumulate moisture in these pores. If these glasses incorporate phosphorus, moisture can chemically connect to the glass by forming the—P.OH bonds from available —P:O as described above.

If SOG is used to planarize these glasses, its curing temperature is limited to about 450° C. and, generally speaking, it will be even more porous than the surrounding glasses and will absorb more moisture than its equivalent volume of glass. If this SOG incorporates phosphorus, moisture can also chemically connect to the SOG by forming the —P.OH bonds.

The presence of moisture in these dielectrics (glass and SOG) can cause serious manufacturing problems such as via poisoning, dielectric cracking, blistering, and can also reduce device reliability.

It is therefore important to prevent water absorption and gettering by these two dielectrics during manufacture of the device to prevent the above-mentioned problems and to ensure device protection by glass and SOG gettering of the metallic ions and water by-products. Our co-pending application U.S. Ser. No. 07/965,264 discloses a process whereby the spin-on glass is applied in a moisture-free environment.

Up to now, the complete elimination of water, silanol —Si.OH, and phosphorus bonded water —P.OH, has not been possible from purely inorganic SOGs used for the fabrication of multilevel aluminum alloys interconnect devices, and the use of such inorganic SOGs for the fabrication of these reliable devices has not therefore been possible.

An object of the invention is to provide a process which permits efficient elimination of absorbed and reacted water from inorganic SOGs and allows inorganic SOGs to be used over low-melting point, non-refractory metals such as aluminum, where exposure temperatures during manufacture do not exceed 450° C.

According to the present invention there is provided in a method of applying spin-on glass (SOG) to a substrate over low-melting point, non-refractory metals such as aluminum, the improvement wherein a layer of applied spin-on glass is subjected to disconnection and outgassing of water and reaction by-products, and said layer is then capped with a protective dielectric layer resistant to moisture diffusion.

Preferably, the SOG is a phosphorus-alloyed inorganic SOG applied to the fabrication of multilevel aluminum alloy interconnects in integrated circuits, and the capping dielectric layer is phosphosilicate glass. Contact holes are then opened in the protective layer to allow the deposition of a second interconnect layer after a further degassing step.

The invention also provides in a method of applying an interconnect track to a semiconductor wafer, comprising depositing a first layer of interconnect material on the wafer, etching said first layer to leave the desired interconnect track pattern, depositing a first layer of dielectric over the etched interconnect tracks; applying one or more layers of spin-on glass over the first layer of dielectric to planarize said first dielectric layer; performing disconnection and outgassing of water and its by-products; depositing a protective, moisture diffusion resistant dielectric capping layer; opening contact holes through the deposited layers to reach the first interconnect layer while the wafers are held in a moisture-free environment to prevent water pick-up through these holes; applying a second layer of interconnect material; and etching the second layer of interconnect material in the desired pattern.

In a preferred embodiment a batch deposition system for the capping layer permits in-situ outgassing of absorbed and bonded water from the SOG prior to the deposition of the capping layer, which acts as a SOG protective layer against water diffusion. A dry or vacuum controlled ambient is used to store and manipulate the wafers after opening contact holes, and a second interconnect deposition system permits in-situ outgassing of absorbed and bonded water from the SOG prior to the deposition of the second level of interconnect material.

The invention still further provides a semiconductor chip, comprising a first layer of interconnect material, a first layer of dielectric on said first layer of interconnect metal; one or more layers of spin-on glass on said first layer of dielectric planarizing said first dielectric layer; a protective, moisture diffusion resistant dielectric capping layer on said spin-on glass layer(s); a second layer of interconnect material reach the first interconnect layer through said contact holes; said first and second interconnect layers defining interconnect tracks on said wafer.

BRIEF DESCRIPTION OF THE DRAWINGS

The principle underlying the invention will now be explained in more detail with the aid of infrared spectroscopy, which is used to detect water, silanol —Si.OH and phosphorus bonded water —P.OH, in dielectrics and SOGs, and by reference to the accompanying drawings in which.

The gettering reactions occurring in the phosphosilicate glass necessitate the destruction of —P:O double bonds. Since the amount of such double bonds is not infinite, the gettering action of any phosphosilicate is limited to its number of "available" —P:O double bonds. When all the —P:O double bonds are used up, the phosphosilicate material no longer acts as a barrier against impurities diffusion and it becomes permeable.

As an example, if the phosphosilicate is used to getter water vapour and its by-products like $OH^-$, $H^+$, and $H_3O^+$, the detection of water, of the residual available —P:O double bonds, of the formed —P.OH, and of other important bonds is possible by using infrared spectroscopy. The following table gives the approximate location of the infrared absorption bands associated with the different molecular vibration of the mentioned bonds:

| ABSORPTION MECHANISM | APPROX. WAVENOS. $[cm^{-1}]$ |
| --- | --- |
| in phase stretching of O—H in "H.OH" | 3350 |
| in phase stretching of O—H in "H.OSi" | 3650 |
| in phase stretching of O—H in "H.OP" | 3700 |
| in phase stretching of O—Si in "Si.OH" | 930 |
| in phase stretching of O—Si in "Si.OSi" | 1070 |
| in phase stretching of O—Si in "Si.OP" | 1090 |
| in phase stretching of O—P in "P:O" | 1280 |
| in phase stretching of O—P in "P.O$^-$" | 1070 |
| in phase stretching of O—P in "P.OH" | 950 |
| in phase stretching of O—P in "P.OSi" | 1160 |
| in phase stretching of O—P in "P.OP" | 1200 |
| out phase stretching of O—Si in "Si.OSi" | 1140 |
| bending of Si—O—Si | 810 |
| rocking of Si—O—Si | 460 |

Figure 1A:
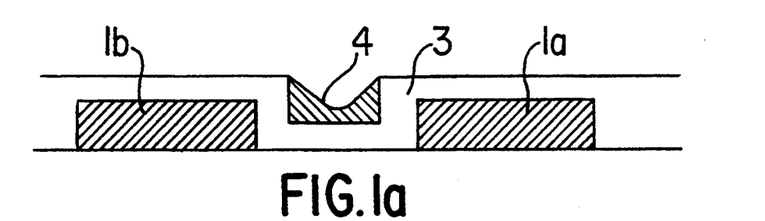
FIGS. 1a to 1e show the Various stages in the manufacture of an aluminum interconnect semiconductor device.
Figure 1B:
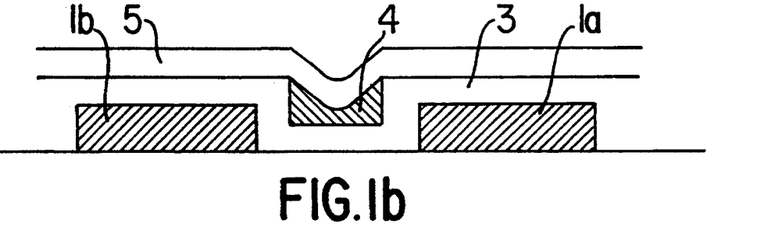
Figure 1C:
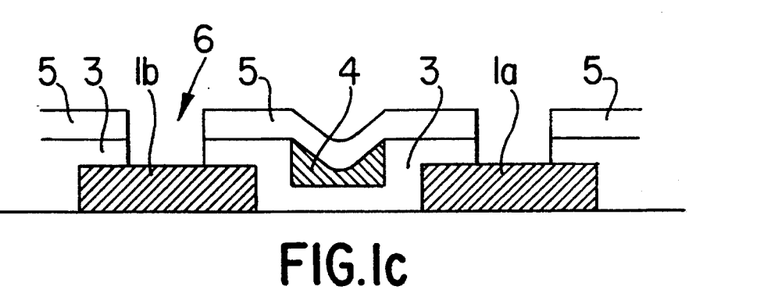
Figure 1D:
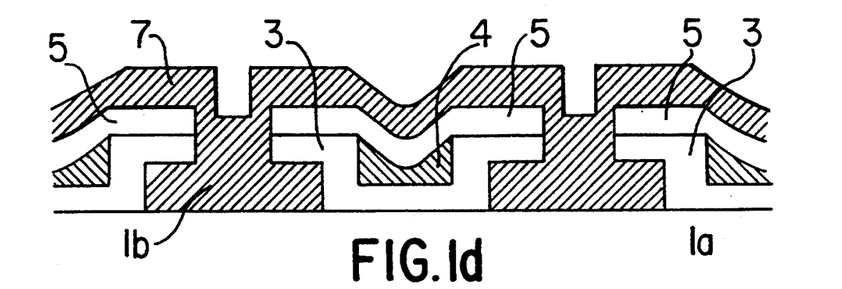
Figure 1E:
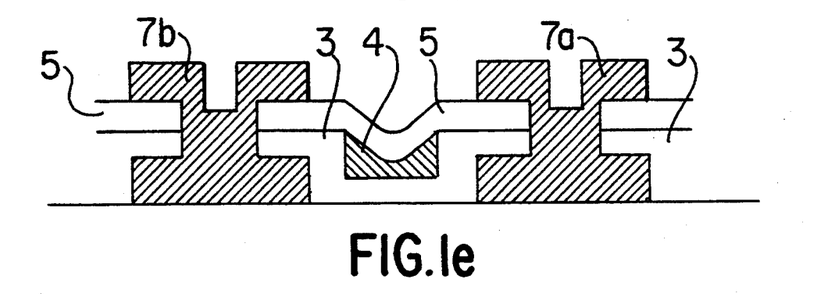
Figure 2A:
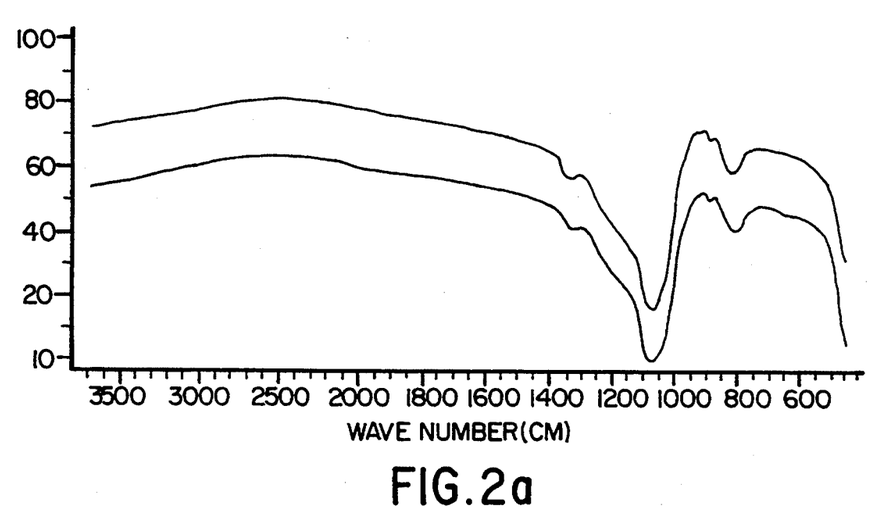
FIGS. 2a and 2b are the infrared spectra of dry and water-saturated infrared spectra respectively.
Figure 2B:
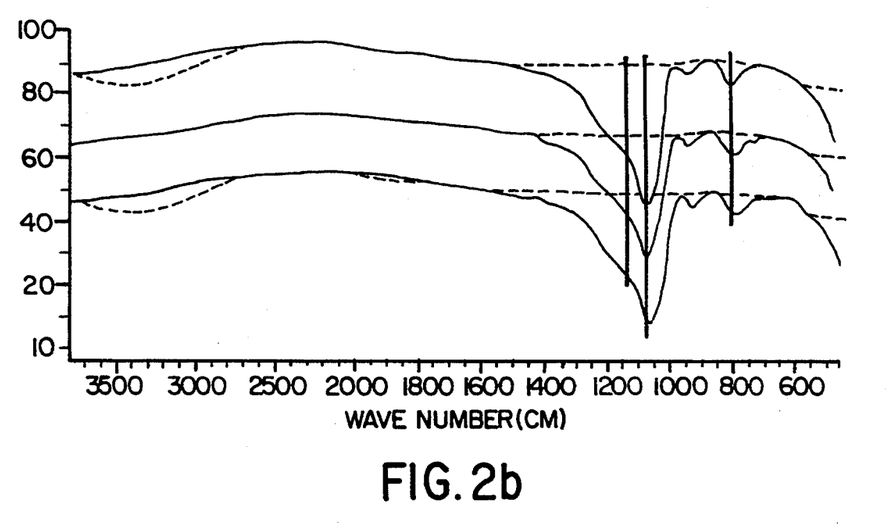

The spectra shown in FIGS. 2a and 2b illustrate the effect of long exposure of a phosphosilicate thin film to water vapour; the —P:O absorption peak totally disappears while three new absorption peaks (950, 3400, and 3700 cm$^{-1}$) appear. The water vapour is captured by the —P:O bonds and reacts accordingly to the mechanism given in reaction (v).

The —P:O (1280 cm$^{-1}$) absorption peak is replaced by three new absorption peaks: —PO.H (3700 cm$^{-1}$), HO.H (3350 cm$^{-1}$), —P.OH (950 cm$^{-1}$). Free water, HO.H at 3350 cm$^{-1}$, is then present since no more —P:O bonds (1280 cm$^{-1}$) are available for its gettering. These three new absorption peaks are reversible at relatively low temperature, i.e. they will disappear if the film is exposed to a dry environment at a temperature of about 450° C. The —P:O peak then reappears. The phosphosilicate is then dry and ready to be used as a getter material.

Two other absorption peaks are also possible: —Si-O.H (3650 cm$^{-1}$), and —Si.OH (930 cm$^{-1}$). These absorption peaks are not related to gettering but indicate a local destruction of the SiO$_2$ network, which is undesirable. In that case, the —Si.O.Si peak will reappear because of a reorganization of the SiO$_2$ network resulting from local silanol⇌silanol (—Si.OH⇌HO.Si—) condensation.

The minimum temperature needed to simultaneously eliminate the three absorption peaks (3600@3700 cm$^{-1}$, 3350 cm$^{-1}$, and 930@950 cm$^{-1}$) is lower than 450° C. and permits the obtention of a dry spin-on glass film over aluminum.

The gettering rate of water vapour by phosphosilicate glasses depends on the diffusion mechanism of water or its by-products (H+, OH−, H$_3$O+) in this glass.

Diffusion of water and its by-products is governed by two mechanisms: diffusion through the bulk of the glass, characterized by a t$^{\frac{1}{2}}$ behaviour, and diffusion through the "pores" or "pipes" of the glass, which is characterized by a t$^{\frac{1}{4}}$ behaviour.

According to these models, the less porous the material, the slower the diffusion and gettering rates, down to a limit which represents the diffusion and gettering rates associated to the perfectly packed amorphous glass.

When the glass is saturated with water, its outgassing is possible at high temperature (450° C. for —P.OH and Si.OH) when exposed to a dry ambient or preferably to a good vacuum.

Free water present in the pores (not bonded) is quickly eliminated and the rate is also driven by the two mentioned mechanisms (t$^{\frac{1}{4}}$ and t$^{\frac{1}{2}}$). When these pores are emptied, outgassing from the thin film glass should stop.

Bonded water must disconnect from the phosphorus (—P.OH) or silicon (—Si.OH) and this condensation limits its elimination rate. At a given temperature, the outgassing rate is limited to the condensation rate of free water from neighbor —P.OH or —Si.OH which depend on the —P.OH or —Si.OH bond strength and statistical distance between two neighbor —P.OH or —Si.OH bonds. Eventually, the outgassing rate becomes negligible at that temperature. An increase of the temperature increases the generation rate and permits longer overlap and condensation of statistically far —P.OH or —Si.OH neighbors; the outgassing rate increases and drops eventually at that new temperature. The outgassing rates becomes negligible eventually. If the material is too porous, its re-exposure to moist air causes a quick re-absorption and gettering of moisture.

The impossibility of observing H$_2$O, —Si.OH, and —P.OH free purely inorganic SOGs when cured at temperature lower than about 800° C. has brought about the belief that purely inorganic SOGs cannot be completely cured at a temperature lower than 450° C. and so cannot be used for the planarization of dielectrics used in the fabrication of multilevel aluminum alloys interconnect devices.

However, the mechanisms of water absorption and gettering by phosphorus doped inorganic SOGs were fully understood. The unavoidable detection of infrared absorption bands of purely inorganic phosphosilicate SOGs cured at a temperature lower than about 450° C.:
 3600@3700 cm$^{-1}$ (—PO.H or —SiO.H stretching)
 3350 cm$^{-1}$ (HO.H stretching)
 930@950 cm$^{-1}$ (—P.OH or —Si.OH stretching)
led to the conclusion that it was impossible to remove residual hydrogen from the low temperature cured inorganic SOGs.

This interpretation of the results was an error resulting from the extremely fast response time of water absorption and gettering by these low temperature cured SOGs. The material is so porous and reactive for gettering when cured at a maximum temperature of about 450° C. that water is absorbed and gettered while the wafer is cooling in moist air during transport from the curing equipment used to the infrared analysis equipment. This conclusion is also supported by a newly published article which discusses the H$_2$O readadsorption and formation of Si—OH bonds in low density PECVD films (Reaction Pathways and Sources of OH groups in Low Temperature Remote PECVD Silicon Dioxide Thin Films; J. A. Thiel, D. V. Tsu, and G lucovsky; Journal Of Electronic Materials, Vol 19, No. 3, 1990).

If the SOGs are cured at temperature exceeding about 800° C. a densification occurs and SOG's pores close. This causes the water absorption rate to diminish to an almost negligible value, which led infrared analysts to conclude that the SOG is hydrogen free. In fact, the high temperature exposed SOG is simply less porous and reactive to ambient moisture.

Some purely inorganic SOGs can effectively be totally H$_2$O, —Si.OH and —P.OH free when properly cured in a dry ambient at a maximum temperature of about 450° C., but cannot be analyzed reliably if the mechanism is not suspected and if the necessary precautions are not taken for its analysis.

A thorough knowledge of SOGs, the optimized curing technique and the rapid mechanism for water absorption brings a totally new perspective to SOG technology. The invention makes it possible to efficiently manufacture extremely reliable multilevel aluminum alloy interconnect devices with purely inorganic SOGs since these can be made hydrogen free and extremely efficient for gettering. In accordance with this invention good results can be obtained with SOGs of this purely inorganic family.

The invention will now be described in more detail. with reference to the following tests carried out on a semiconductor substrate (shown in FIG. 1a to 1e) fabricated as follows:

1) First layer of interconnect material (1a, 1b) was deposited on the substrate.
2) This layer was etched using photolithography.

3) A first layer of dielectric "ID1" (3) was deposited over the etched interconnect tracks.

4) Phosphorus-alloyed "SOG" (4) was applied over the first layer of dielectric in one or many coats and heated in-line to permit its stabilization. The SOG being liquid, fills crevices and is absent over high topologies. This step is later referred as "TAZMO" step.

5) The obtained wafers were loaded in a batch atmospheric pressure forming gas ($N_2+10\%H_2$) ambient at temperature of about 425° to 450° C. This step is later referred as the "ALLOY" step.

6) The obtained wafers were loaded in a batch dielectric deposition system that permitted in-situ disconnection and outgassing of water and its by-products before the deposition of a protective moisture diffusion resistant dielectric "ID2" capping layer 5) of phosphosilicate glass. This step is later referred as "ID2" step. After that step, SOG was dry and ready for gettering. Being very porous, it efficiently protected the device against water and metallic ion movement down to the transistors.

7) Contact holes (6) were opened through the ID1-SOG-ID2 dielectric sandwich to reach the first level of interconnect. The wafers were held in a dry or vacuum ambient after hole opening to prevent water pick-up from these hole 8) The wafers were loaded in the second level of interconnect material deposition system and an in-situ outgassing of potentially absorbed moisture was carried out prior to the deposition of the second level of interconnect material (7) which covered the sidewalls of the etched holes, thus protecting the exposed SOG.

9) The second level of interconnect material was etched using photolithography (7a, 7b).

The obtained sandwiched SOG was then dry and ready for extremely efficient gettering. This approach permits the obtention of high yield processing of reliable multilevel aluminum alloy interconnect devices using purely inorganic SOGs.

Infrared spectroscopy analysis of 630 nm (10 coats) of ALLIED SIGNAL's P-062A phosphosilicate SOG was performed on films coated and stabilized to show the presence of gettered water in the obtained material.

Figure 3:
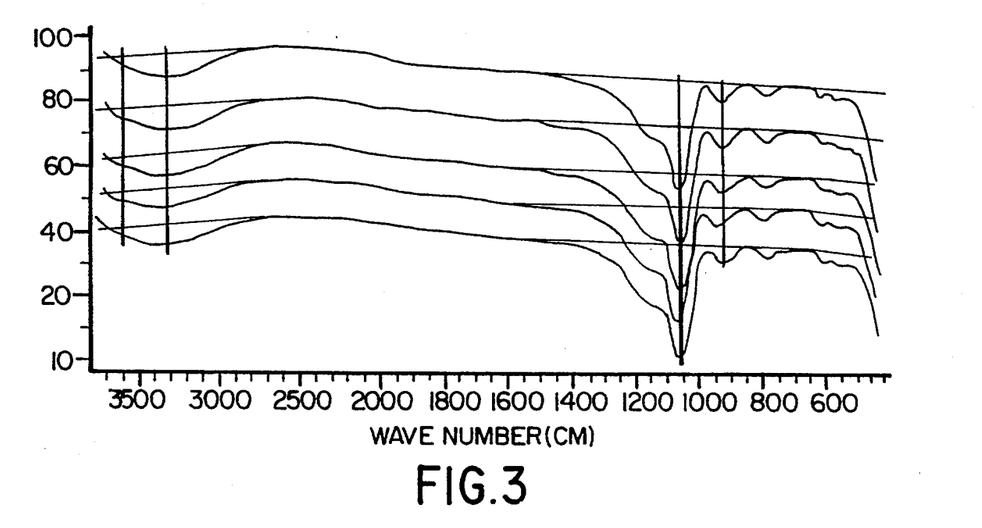
FIG. 3 shows the infrared spectra after a "tazmo" step.

Five such spectra (No. 1 to No. 5) are given by the following table shown in FIG. 3: "INFRARED SPECTRA AFTER "TAZMO" STEP". Spectrum No. 1 is the lowest and spectrum No. 5 highest in the figure.

The associated conditions are:
Spectrum No. 1: 30 minutes after deposition and stabilization.
Spectrum No. 2: 120 minutes after deposition and stabilization.
Spectrum No. 3: 240 minutes after deposition and stabilization.
Spectrum No. 4: 1260 minutes after deposition and stabilization.
Spectrum No. 5: 5580 minutes after deposition and stabilization.

It should be observed noticed that the three water gettering related peaks (3600@3700 cm$^{-1}$ for —SiO.H or —PO.H stretching, 3350 cm$^{-1}$ for HO.H stretching, and 930@950 cm$^{-1}$ for —Si.OH or —P.OH stretching) are present and do not increase with an increase of moist air exposure time, which make sense since gettering occurs very rapidly.

None of these spectra show the —P:O (1280 cm$^{-1}$) peak which effectively confirms that the film is already saturated with water even after 30 minutes of moist air exposure.

Immediately after coating and stabilization, wafers are transferred to the forming gas furnace. Infrared analysis was performed after this "ALLOY" step.

Figure 4:
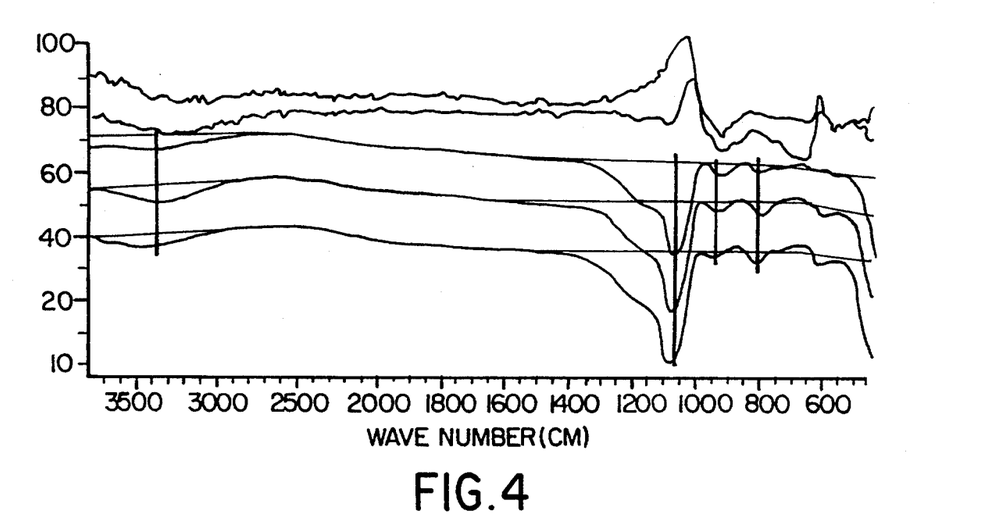
FIG. 4 shows the infrared spectra after an "alloy" step.

Three such spectra (No. 1 to No. 3) are shown in FIG. 4: "INFRARED SPECTRA AFTER "ALLOY" STEP". Spectrum No. 1 is the lowest and spectrum No. 3 is the third from the bottom in the figure.

The associated conditions are:
Spectrum No. 1: 10 minutes after the completion of the "ALLOY" step.
Spectrum No. 2: 1080 minutes after the completion of the "ALLOY" step.
Spectrum No. 3: 5400 minutes after the completion of the "ALLOY" step.

Again, it is should be observed that the three water gettering related peaks are present and that the —P:O is absent. The film is still saturated with water even after 10 minutes of moist air exposure.

Immediately after removal of the "ALLOY" furnaces, the wafers were transferred to the "ID2" vacuum batch deposition system for in-situ outgassing. The deposition of the ID2 protective film was not done but the equivalent heat treatment was performed in-situ. Infrared analysis was performed after this "ID2" step.

Figure 5:
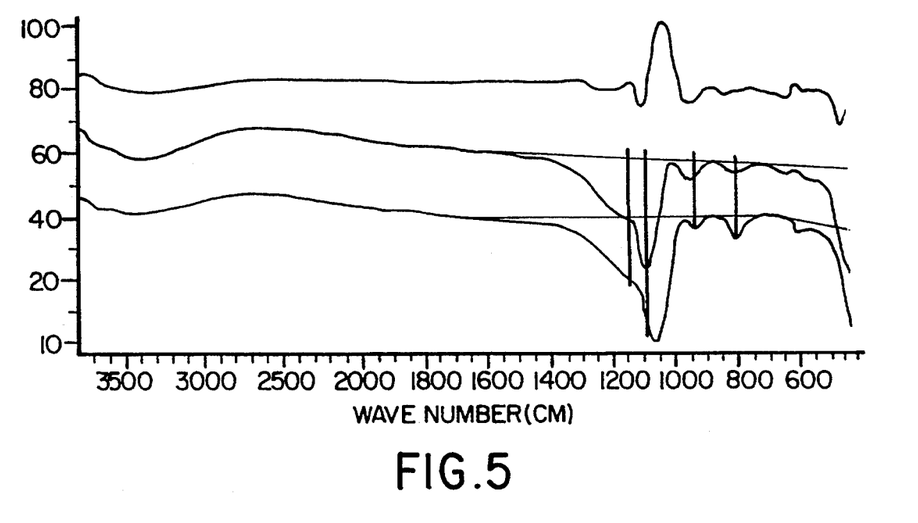
FIG. 5 shows the infrared spectra after an "ID2" step; without 150 nm ID2 deposition.

Two such spectra (No. 1 to No. 2) are shown in FIG. 5: "INFRARED SPECTRA AFTER "ID2" STEP; WITHOUT 150 nm ID2 DEPOSIT". Spectrum No. 1 is the lowest and spectrum No. 2 is the second from the bottom in the figure.

The associated conditions are:
Spectrum No. 1: 30 minutes after the completion of the "ID2" step.
Spectrum No. 2: 4320 minutes after the completion of the "ID2" step.

Again, it is observed that the three water gettering related peaks are present and that the —P:O is absent. In this case, the longer the exposure time, the more important the absorption peaks intensity. The material already has a smaller porosity which reduces water diffusion rate. Nevertheless, both spectra shows the presence of residual hydrogen.

One wafer was taken after the "TAZMO" step and aged in moist air for about 1000 minutes, one wafer was taken after the "ALLOY" step and aged in moist air for about 300 minutes, and one wafer was taken immediately after removal of the "ALLOY" step. These three wafers were transferred to the "ID2" vacuum batch deposition system for in-situ outgassing. The deposition of a 150 nm ID2 protective film was done in-situ. Infrared analysis is performed after this "ID2" step.

Figure 6:
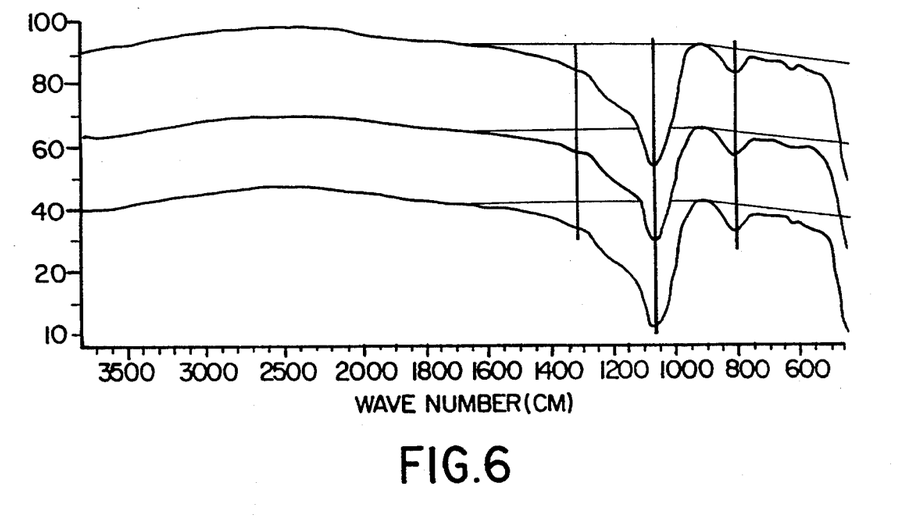
FIG. 6 shows the infrared spectra after an "ID2" step; with 150 nm ID2 deposition.

Three such spectra (No. 1 to No. 3) are shown in FIG. 6: "INFRARED SPECTRA AFTER "ID2" STEP; WITH 150 nm ID2 DEPOSIT". Spectrum No. 1 is the lowest and spectrum No. 3 the highest in the figure.

The associated conditions are:
Spectrum No. 1: 30 minutes after the completion of the "ID2" deposition over the aged "TAZMO".
Spectrum No. 2: 30 minutes after the completion of the "ID2" deposition over the aged "ALLOY".
Spectrum No. 3: 30 minutes after the completion of the "ID2" deposition over an immediately transferred "ALLOY".

It should be observed that the three water gettering related peaks are absent and that the —P:O is effectively present. The —P:O absorption peak is weak because this SOG incorporates only a little amount of phosphorus.

It should also be observed that the three spectra are very similar so that neither the moist air aging neither the intermediate "ALLOY" (in $N_2 + 10\%H_2$) step cause problems for hydrogen removal. This SOG is now perfect for device protection because it is extremely active for water and metallic ion gettering.

These results contradict the generally accepted belief that residual hydrogen (from —POH or —SiOH) cannot be removed from purely inorganic SOGs unless exposed to temperatures higher than about 700° C. This allows of these SOGs to be used for the planarization of dielectrics over temperature sensitive materials such as aluminum alloys and permits the fabrication of multi-level interconnect devices.

If the three wafers described above are placed in a 121° C., 29 psia, 100% $H_2O$ ambient to permit diffusion of water through the imperfect protective capping layer, water should reach the SOG film and be gettered by the SOG's available —P:O bonds. The —P:O infrared absorption band should disappear as gettering occurs while the three others water gettering related absorption bands should appear.

Figure 7:
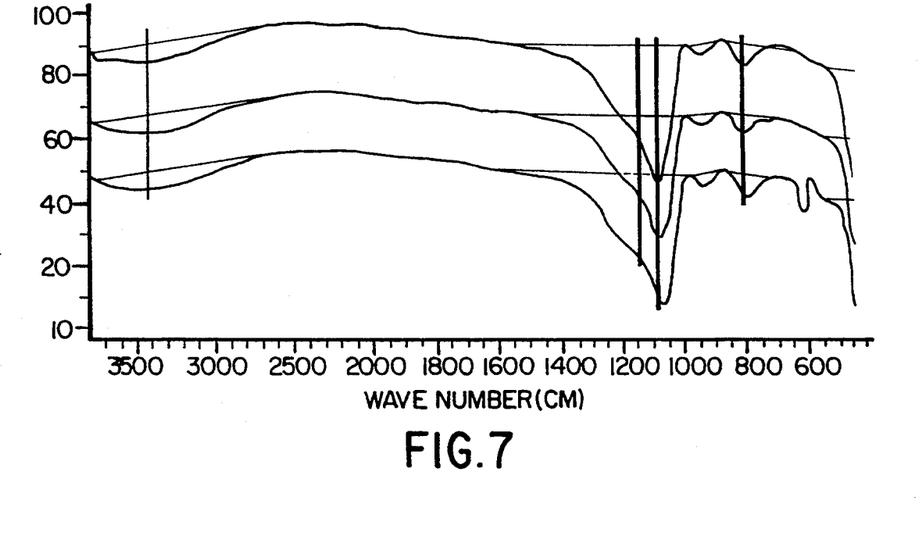
FIG. 7 shows the infrared spectra of pc stressed "ID2" protected sogs.

This experiment was done and three such spectra are shown in FIG. 7: INFRARED SPECTRA OF PC STRESSED "ID2" PROTECTED SOGs"; spectrum No. 1 is the lowest and spectrum No. 3 the highest in the figure.

The associated conditions were:
Spectrum No. 1: 30 minutes after pressure cooker stressed "ID2" protected aged "TAZMO".
Spectrum No. 2: 30 minutes after pressure cooker stressed "ID2" protected aged "ALLOY".
Spectrum No. 3: 30 minutes after pressure cooker stressed "ID2" protected immediately transferred "ALLOY".

As predicted, it was observed that the three water gettering related peaks are present and that the —P:O effectively disappeared. The stressed SOG is again saturated with moisture.

It was also observed that the spectra are very similar so that neither the moist air aging nor the "ALLOY" ($N_2 + 10\%H_2$) step affect the gettering behaviour. Such water saturated SOGs are useless for further gettering and such water-saturated dielectrics are useless for device protection.

If the three wafers described above are outgassed in-situ in the "ID2" deposition system to permit disconnection and diffusion of SOG's gettered water from the SOG through the imperfect protective capping layer to the vacuum ambient, it is possible to obtain the original dry SOG. If the wafers are removed without deposition of another 150 nm of ID2 cap, the comparison of the infrared spectra permits the confirmation of pure gettering without decomposition.

Figure 8:
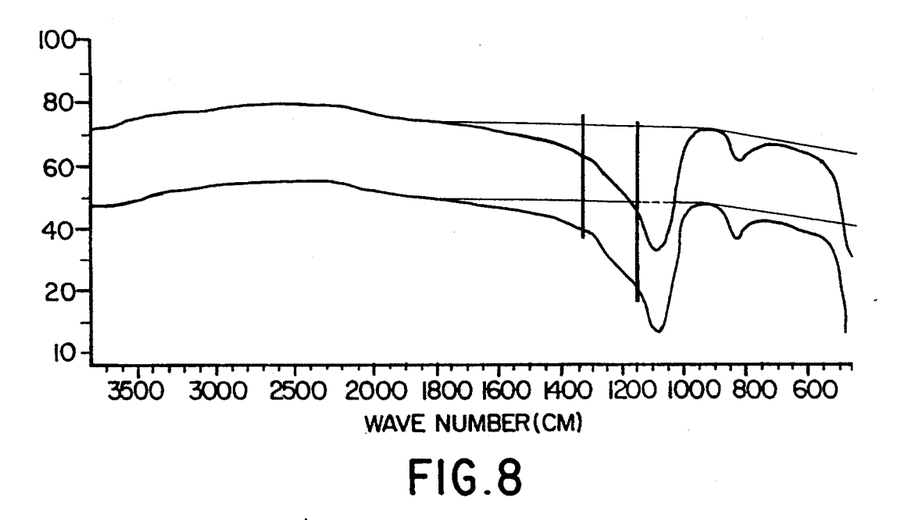
FIG. 8 shows the infrared spectra of dried pc stressed "ID2" protected sogs.

This experiment was carried out and two such spectra are shown in FIG. 8: "INFRARED SPECTRA OF DRIED PC STRESSED "ID2" PROTECTED SOGs"; spectrum No. 1 is the lowest and spectrum No. 2 is the highest in the figure.

The associated conditions were:
Spectrum No. 1: 30 minutes after "ID2" dried pressure cooker stressed "ID2" protected aged "TAZMO".
Spectrum No. 2: 30 minutes after "ID2" dried pressure cooker stressed "ID2" protected immediately transferred "ALLOY".

As predicted, it was observed that the three water gettering related peaks are absent and that the —P:O is effectively present. The obtained spectra were the same as the original ones shown in FIG. 5 (INFRARED SPECTRA AFTER "ID2" STEP; WITH 150 nm ID2 DEPOSIT) and the —P:O absorption peak is back to its original value, which indicates pure gettering without phosphorus leaching.

Again, the two spectra are very similar so that the moist air aging after "TAZMO" causes absolutely no problem for hydrogen removal. This SOG is again perfect for device protection because it is still extremely active for water and metallic ions gettering.

Although this invention is more beneficial for phosphorus-alloyed inorganic SOGs, it is also beneficial on boron or arsenic or other metal alloyed inorganic SOGs, on unalloyed inorganic SOGs, on alloyed quasi-inorganic SOGs (incorporation some —$CH_3$, —$C_2H_5$ or some others organic bonds), and on unalloyed quasi-organic SOGs. The number of coats can be one or many and the intermediate "ALLOY" can be used or not, as required.

The in-situ "ID2" batch outgassing can be replaced by vacuum treatment, dry gas high pressure treatment, in-situ plasma treatment, by in-situ ozone treatment, in-situ UV treatment, in-situ microwave treatment, or by a combination thereof.

The "ID2" deposition can be a non-batch step (single wafer, for example) if an in-situ batch treatment is possible before to completely remove absorbed or connected water and its by-products. The "in-situ" treatment can be a non-batch one if the in-situ treatment allows the complete removal of absorbed or connected water and its by-products.

The "ID2" material can be a material other than phosphosilicate glass. For example, it can be:
Borosilicate glass, $Si_wO_xB_yH_z$
Arsenosilicate glass, $Si_wO_xAs_yH_z$
Lead silicate glass, $Si_wO_xPb_yH_z$
Silicon nitride, $Si_xN_yH_z$
Silicon oxynitride, $Si_wN_xO_yH_z$
Fluorinated silicon nitride, $Si_wN_xF_yH_z$
Fluorinated silicon oxynitride,
$Si_vN_wO_xF_yH_z$
or any combination of these. In fact, since "ID2" role is to protect SOG against water absorption, any 5 material having low water permeation, compatible dielectric constant, pinhole density and breakdown resistance can be used.

This "ID2" material can be deposited by:
APCVD: atmospheric pressure chemical vapour deposition
LPCVD: low pressure chemical vapour deposition
PECVD: plasma enhanced chemical vapour deposition, biased or not
LACVD: laser assisted chemical vapour deposition
PhCVD: photochemical vapour deposition
BS: sputtering or bias sputtering
ECR: electron cyclotron resonance, biased or not
SPIN-ON: a spin-on material like polyimide
or by any combination thereof. The principle is to protect the SOG during processing and to keep it water-free.

The "alloy" step in the forming gas "N$_2$+H$_2$" can be replaced by an in-situ "Alloy" step in the "ID-2" deposition system or in an in-situ outgassing station attached to the "ID-2" deposition system. This forming gas step can be totally eliminated with good results. The use of this alloy cycle is interesting because it is required for other reasons and permits the application of heat treatment to the SOG prior to capping with ID-2.

I claim:

1. A method of planarizing a semiconductor wafer having interconnect tracks metal of formed thereon, comprising applying a layer of inorganic spin-on glass to the wafer, curing said spin-on glass at a temperature not exceeding about 450° C., then placing the wafer in a dielectric deposition chamber, subjecting the wafer to in situ disconnection and outgassing of water and reaction by-products, and then capping the wafer in a moisture-free environment with a protective dielectric layer resistant to moisture diffusion.

2. A method as claimed in claim 1, wherein said metal is aluminum.

3. A method as claimed in claim 1, wherein the SOG is a phosphorus-alloyed SOG.

4. A method as claimed in claim 1, wherein that said dielectric capping layer is selected from the group consisting of: phosphosilicate glass; Borosilicate glass, $Si_wO_xB_yH_z$; Arsenosilicate glass, $Si_wO_xAs_yH_z$; Lead silicated glass, $Si_wO_xPb_yH_z$; Silicon nitride, $Si_xN_yH_z$; Silicon oxynitride, $Si_wN_xO_yH_z$; Fluorinated silicon nitride, $Si_wN_xF_yH_z$; and Florinated silicon oxynitride, $Si_vN_wO_xF_yH_z$.

5. A method as claimed in claim 1, wherein it the wafer is fabricated in the following manner:

a) a first layer of interconnect metal is deposited on the wafer;

b) said first layer is etched to leave the desired interconnect track pattern;

c) a first layer of dielectric is deposited over the etched interconnect tracks;

d) one or more layers of spin-on glass is applied over the first layer of dielectric to planarize said first dielectric layer;

e) disconnection and outgassing of water and its by-products is performed;

d) a protective, moisture diffusion resistant dielectric capping layer is deposited;

e) contact holes are opened through the deposited layers to reach the first interconnect layer while the wafers are held in a moisture-free environment to prevent water pick-up through these holes;

f) a second layer of interconnect metal is applied; and g) the second layer of interconnect metal is etched in the desired pattern.

6. A method as claimed in claim 5, wherein after application of the SOG layer the wafer is subjected to a forming gas at atmosphere pressure.

7. A method as claimed in claim 6 wherein said forming gas is a mixture of nitrogen and about 10% hydrogen.

8. A method as claimed in claim 5, wherein a second outgassing is performed after the opening of said contact holes and prior to the application of said second layer of interconnect metal.

9. A method as claimed in claim 5, wherein gettering is carried out on the wafer after etching of the second layer of interconnect metal.

10. A method as claimed in claim 5, wherein the outgassing is carried out in-situ in a batch dielectric deposition system.

11. A method as claimed in claim 5, wherein the outgassing is carried out in a batch outgassing station attached to an in-situ single wafer or batch deposition system.

* * * * *